(12) United States Patent
Clem

(10) Patent No.: US 9,476,939 B2
(45) Date of Patent: Oct. 25, 2016

(54) GAINING TIMING ACCURACY OF DIGITAL SIGNALS THROUGH AVERAGING IN THE X-AXIS

(71) Applicant: Jonathan D. Clem, Hillsboro, OR (US)

(72) Inventor: Jonathan D. Clem, Hillsboro, OR (US)

(73) Assignee: TEKTRONIX, INC., Beaverton, OR (US)

(*) Notice: Subject to any disclaimer, the term of this patent is extended or adjusted under 35 U.S.C. 154(b) by 556 days.

(21) Appl. No.: 13/631,854

(22) Filed: Sep. 28, 2012

(65) Prior Publication Data

US 2014/0095566 A1    Apr. 3, 2014

(51) Int. Cl.
*G01R 31/3177* (2006.01)

(52) U.S. Cl.
CPC ................. *G01R 31/3177* (2013.01)

(58) Field of Classification Search
None
See application file for complete search history.

(56) References Cited

U.S. PATENT DOCUMENTS

| | | |
|---|---|---|
| 4,777,616 A | 10/1988 | Moore et al. |
| 5,282,213 A | 1/1994 | Leigh et al. |
| 5,548,539 A * | 8/1996 | Vlach et al. ............ 703/6 |
| 2002/0048336 A1* | 4/2002 | Keating et al. .......... 375/371 |
| 2007/0285081 A1 | 12/2007 | Carole et al. |

OTHER PUBLICATIONS

Extended European Search Report for European Patent Application No. 13186758.2, dated Jan. 23, 2014, 5 pages.

* cited by examiner

*Primary Examiner* — Michael D Yaary
(74) *Attorney, Agent, or Firm* — Marger Johnson

(57) ABSTRACT

Rising and falling edges captured by a digital acquisition device appear to chatter on the X-axis by two or more sampling bin boundaries as live acquisition continually updates. This leads to a confusing display of limited usefulness. Averaging of multiple edges eliminates chatter while at the same time increases timing accuracy of the edges beyond the abilities of the base acquisition system. An object of the invention is to display a waveform for an averaged digital signal converted from an analog signal received by a signal processing instrument. A plurality of data acquisitions is stored in memory, and for each data acquisition, a number of rising and falling edges are identified. Each rising and falling edge is counted in each data acquisition. From these counted edges, an average waveform is calculated from the plurality of data acquisitions. The average waveform is displayed as an improved representation of the digital signal.

11 Claims, 8 Drawing Sheets

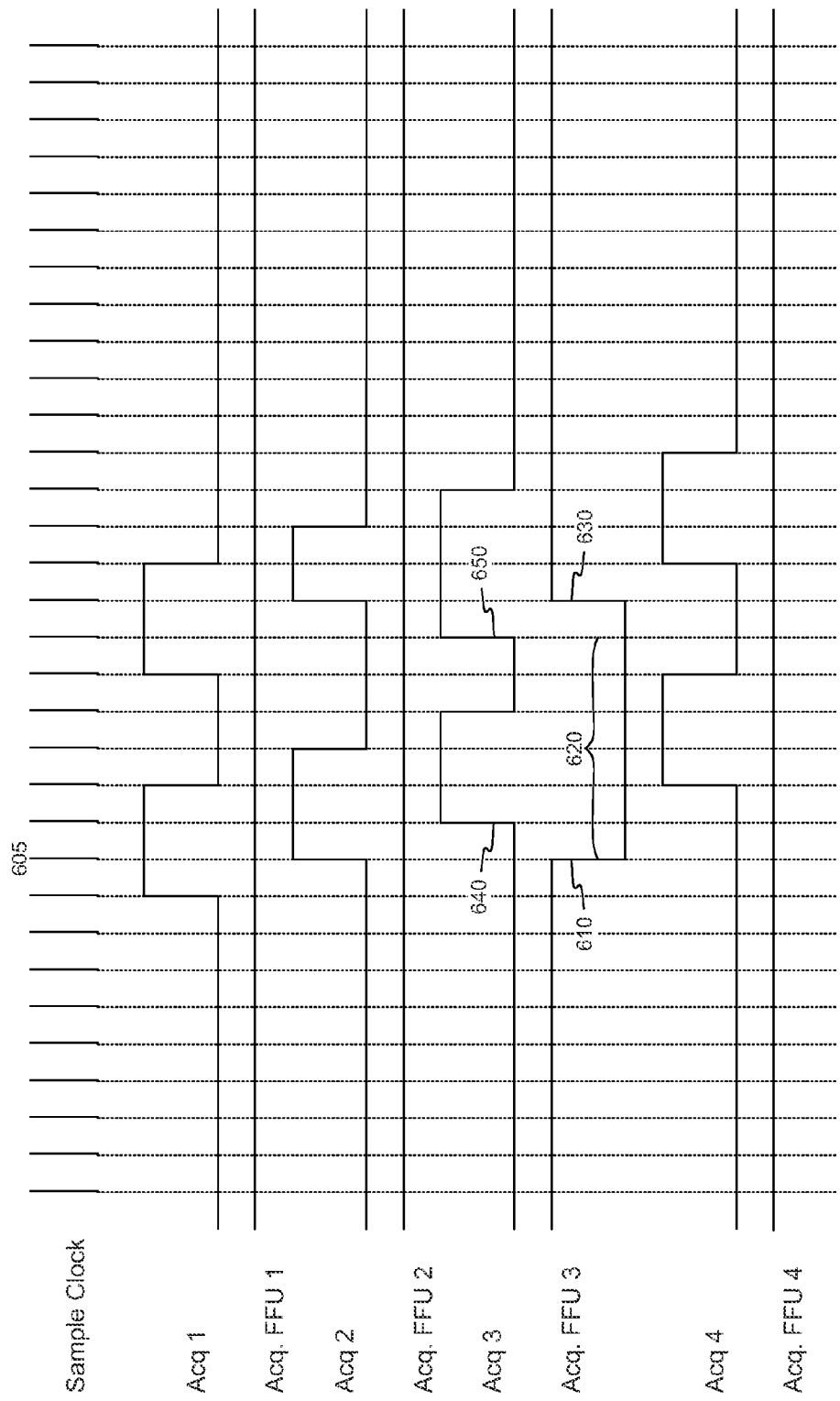

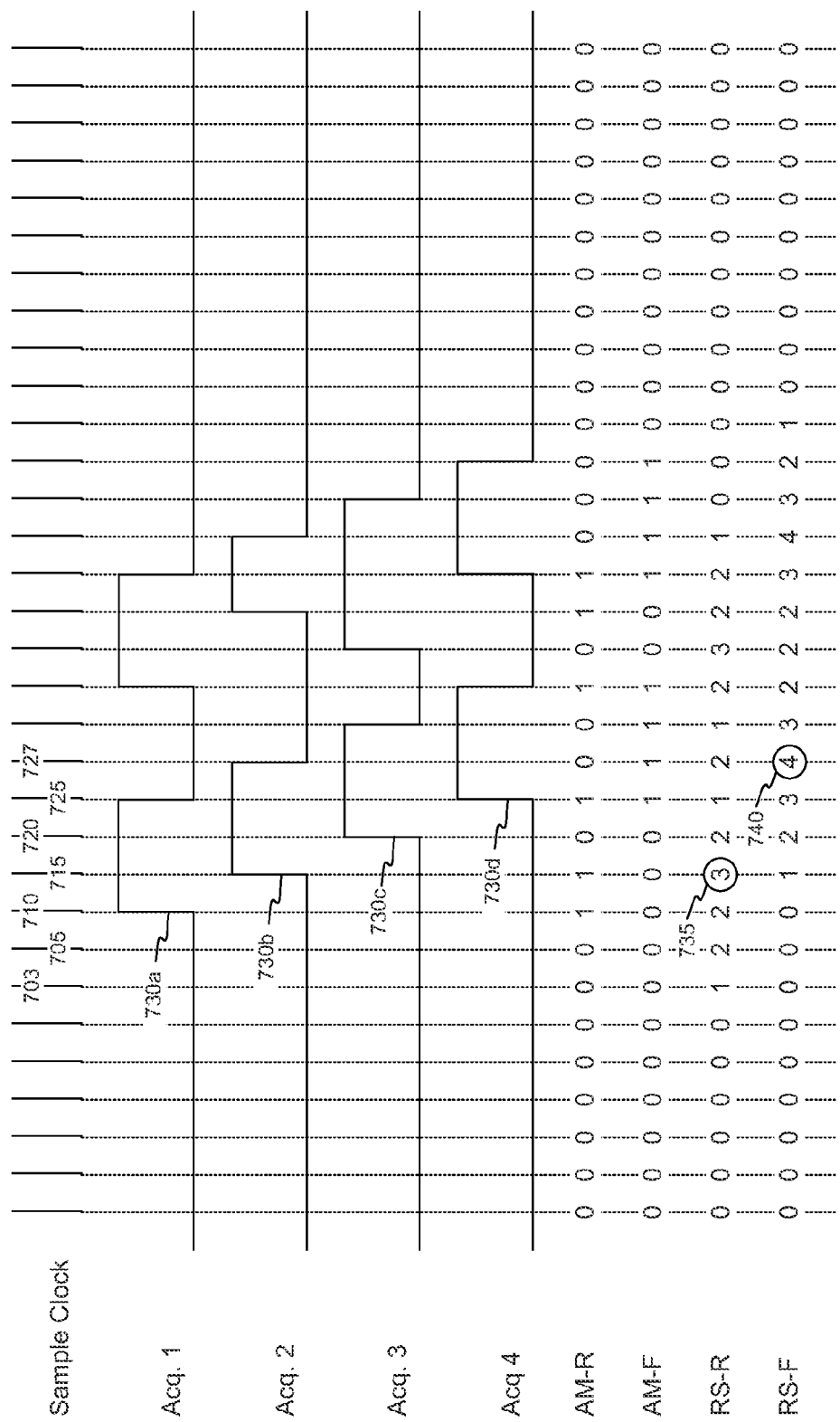

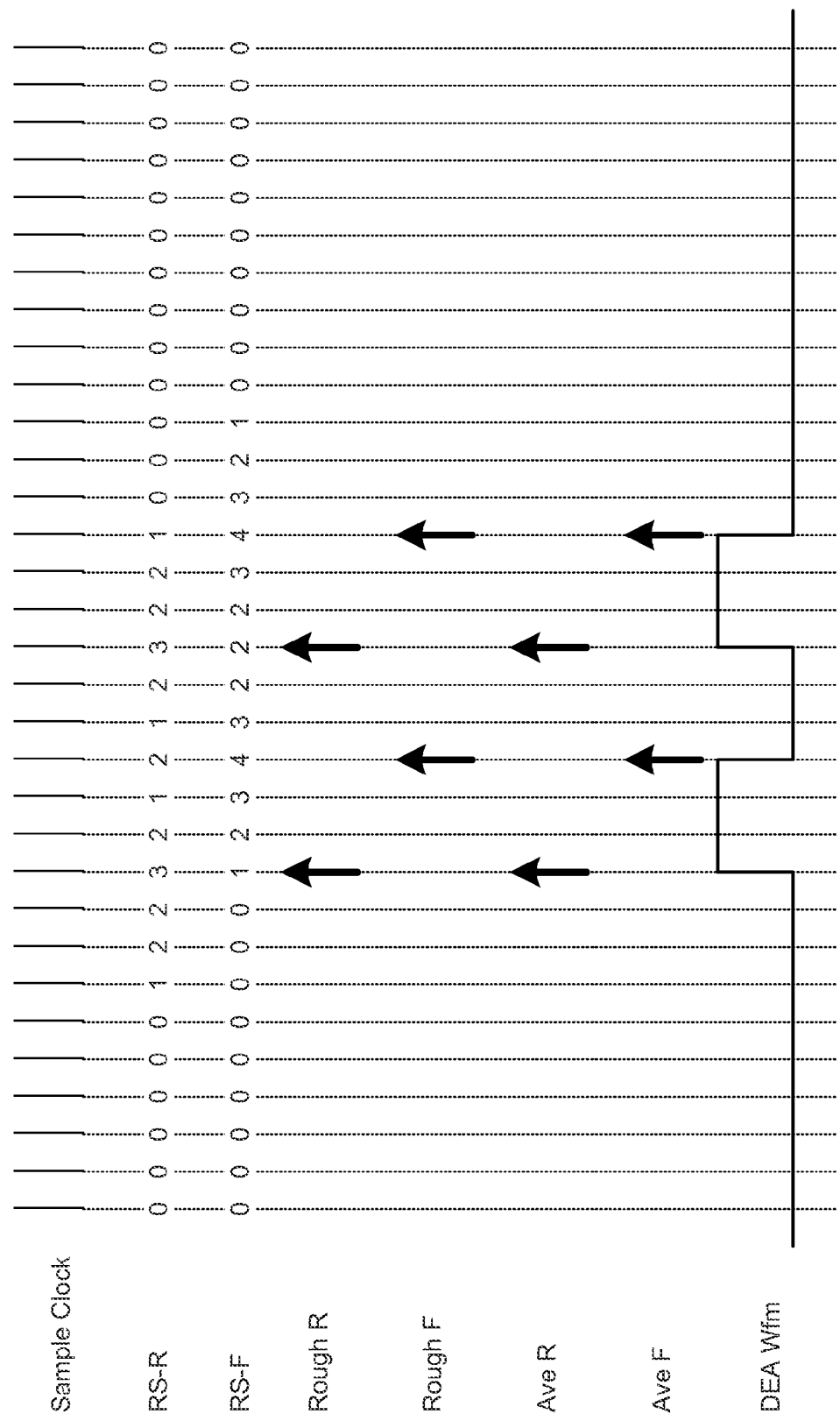

GAINING TIMING ACCURACY OF DIGITAL SIGNALS THROUGH AVERAGING IN THE X-AXIS

BACKGROUND

Digital acquisition devices, such as the Tektronix TLA7000 Logic Analyzer, enable electrical engineers to measure the signals produced by the digital systems that they design. Research labs use digital acquisition devices to observe correctness of timing and intensity of signals in microprocessors, memory, buses, and other components of digital systems. Acquisition devices play a major role in the development of the continually advancing electronics industry.

A digital acquisition device will typically display a sensed signal as a sharply elevated or descending step. The rise from "off" to "on" and the descent from "on" to "off" is usually synchronized with the period of a clock in the system under test, and the transition from one state to the other is represented visually as a vertical edge. It is useful to distinguish the clock of a system under test from a clock of a digital acquisition device. In order to provide high resolution on the signal under test, the sample clock of the digital acquisition device must pulse, and therefore sample the signal under test, at a frequency higher than the frequency of the tested system's clock. This yields meaningful measurements to engineers using the acquisition device. The distance between two consecutive pulses of the clock for the digital acquisition device may be referred to as a sampling bin, and the pulse itself is the sampling bin boundary. A rising or falling edge in an ideal scenario will consistently land within a single sample bin and, therefore, will be consistently associated with a single sample clock edge.

When testing a particular design, engineers sometimes measure a signal occurring in a repeated pattern. The acquisition device may be programmed to begin data acquisition with a trigger, which can itself be a rising or a falling edge. By supplying a repeating input, engineers can observe whether an input predictably and reliably generates a consistent output. Under ideal circumstances, the output is displayed as a static series of steps if the device is working as expected. Circumstances, however, are not always ideal.

Depending on metastable conditions (inability of the system under test to settle on a stable "on" or "off"), noise, and skew relative to the trigger event, edges often fall within a sampling bin and not directly on the sampling bin boundary. Multiple edges are drawn then on the screen of the acquisition device to represent what is actually a single edge appearing in multiple acquisitions. These edges appear to chatter on the X-axis by two or more sampling bin boundaries as the live acquisition continually updates. This leads to a confusing display of limited usefulness. The live update of digital channels would be made more meaningful if the chatter could be eliminated.

Accordingly, there remains a need for an improved method of displaying a waveform for a digital acquisition device.

SUMMARY

Averaging of multiple edges would eliminate chatter while at the same time increase the timing accuracy of the edges beyond the abilities of the base acquisition system. It is, therefore, an object of the invention to display a waveform for an averaged digital signal, converted from an analog signal and received by a signal processing instrument. A plurality of data acquisitions is stored in memory, and for each data acquisition, a number of rising and falling edges are identified. Each rising and falling edge is counted in each data acquisition. From these counted edges, an average waveform is calculated from the plurality of data acquisitions. The average waveform is displayed as an improved representation of the digital signal.

BRIEF DESCRIPTION OF THE DRAWINGS

FIG. 6 illustrates the method for flagging an edge as fit for use (FFU) according to embodiments of the invention.

FIG. 7 illustrates the collecting and storing, in acquisition memory, of both the rising and falling edges and their running sums according to embodiments of the invention.

FIG. 8 illustrates the placement of rough edges and average edges to create the digital edge average (DEA) waveform according to embodiments of the invention.

DETAILED DESCRIPTION

Figure 1:
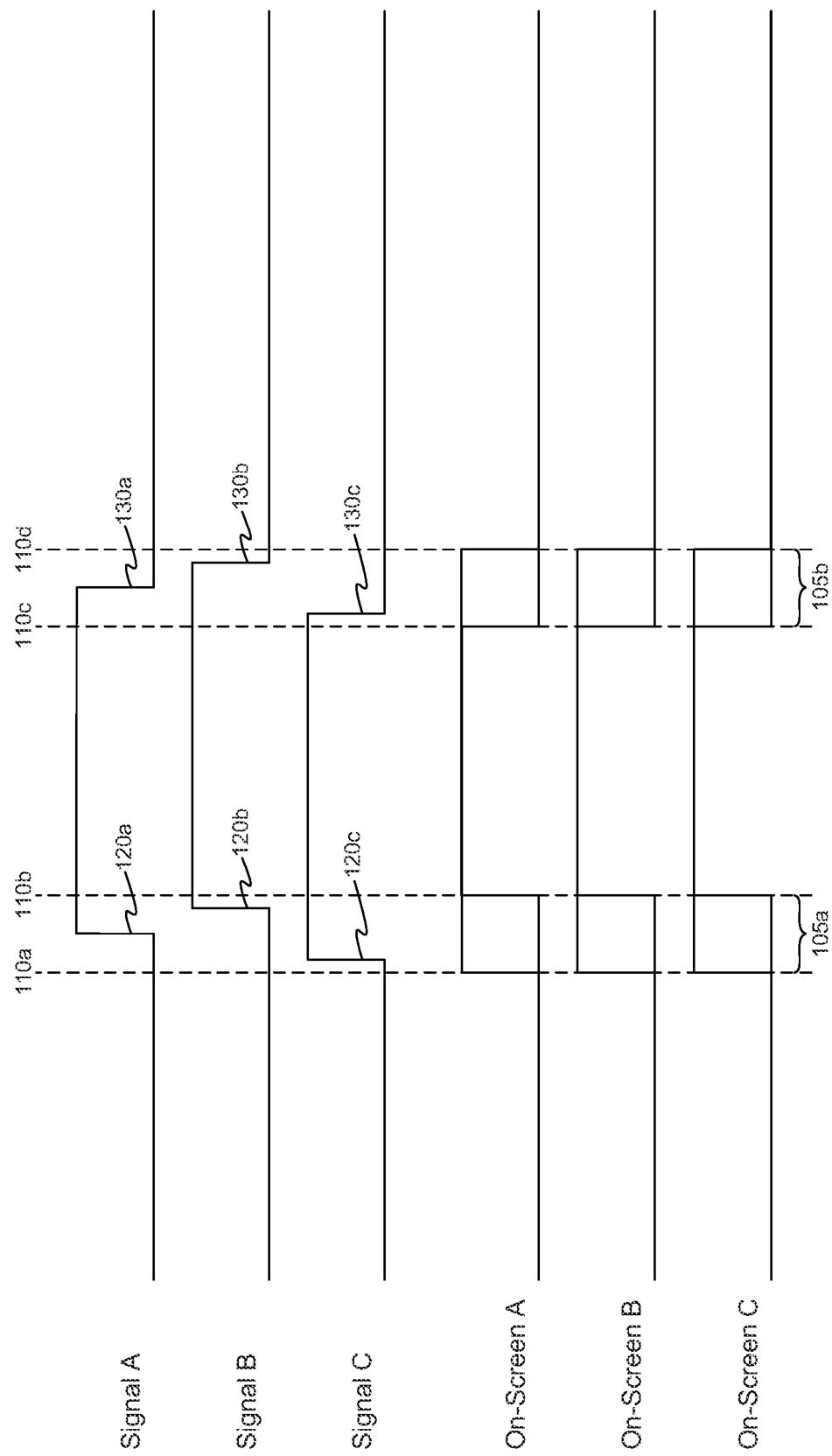
FIG. 1 illustrates a simplified live display of conventional digital waveforms.

For applications where a digital sample rate represents multiple pixels in the horizontal direction on screen, the digital transitions can appear to chatter across sampling bins. Live updates of digital channels in this scenario are only useful for seeing logic levels of the digital channels and rough placement of edges on the X-axis. They also require users to have some level of understanding of the nuts and bolts of the digital acquisition system to interpret waveforms that do not appear visually similar to other timing diagrams they are used to seeing. FIG. 1 illustrates a simplified live display of conventional digital waveforms.

Referring to FIG. 1, digital signals A, B, and C repeat over a period of time, are synchronous to the same tested system's clock, but are otherwise unrelated to one another. The rising edge 120*a* of Signal A is located in the middle of sampling bin 105*a*, and falling edge 130*a* of Signal A is located in the middle of sampling bin 105*b*. Each edge is equidistant from the nearest sampling bin boundaries 110*a-d*. The rising edge 120*b* of Signal B is located nearest sampling bin boundary 110*b*, and falling edge 130*b* of Signal B is located nearest sampling bin boundary 110*d*. The rising edge 120*c* of Signal C is located nearest the sampling bin boundary 110*a*, and the falling edge 120*c* of Signal C is located nearest the sampling bin boundary 110*c*. When displayed on-screen, all three signals appear to have coincident rising and falling edges. Over multiple acquisitions, the edges for each signal bounce back and forth on sampling bin boundaries 110*a-d* that border sampling bins 105*a* and 105*b*. This can be attributed, in part, to the asynchronous and random relationship between the sample clock of the acquisition device and the clock of the system under test.

Figure 2:
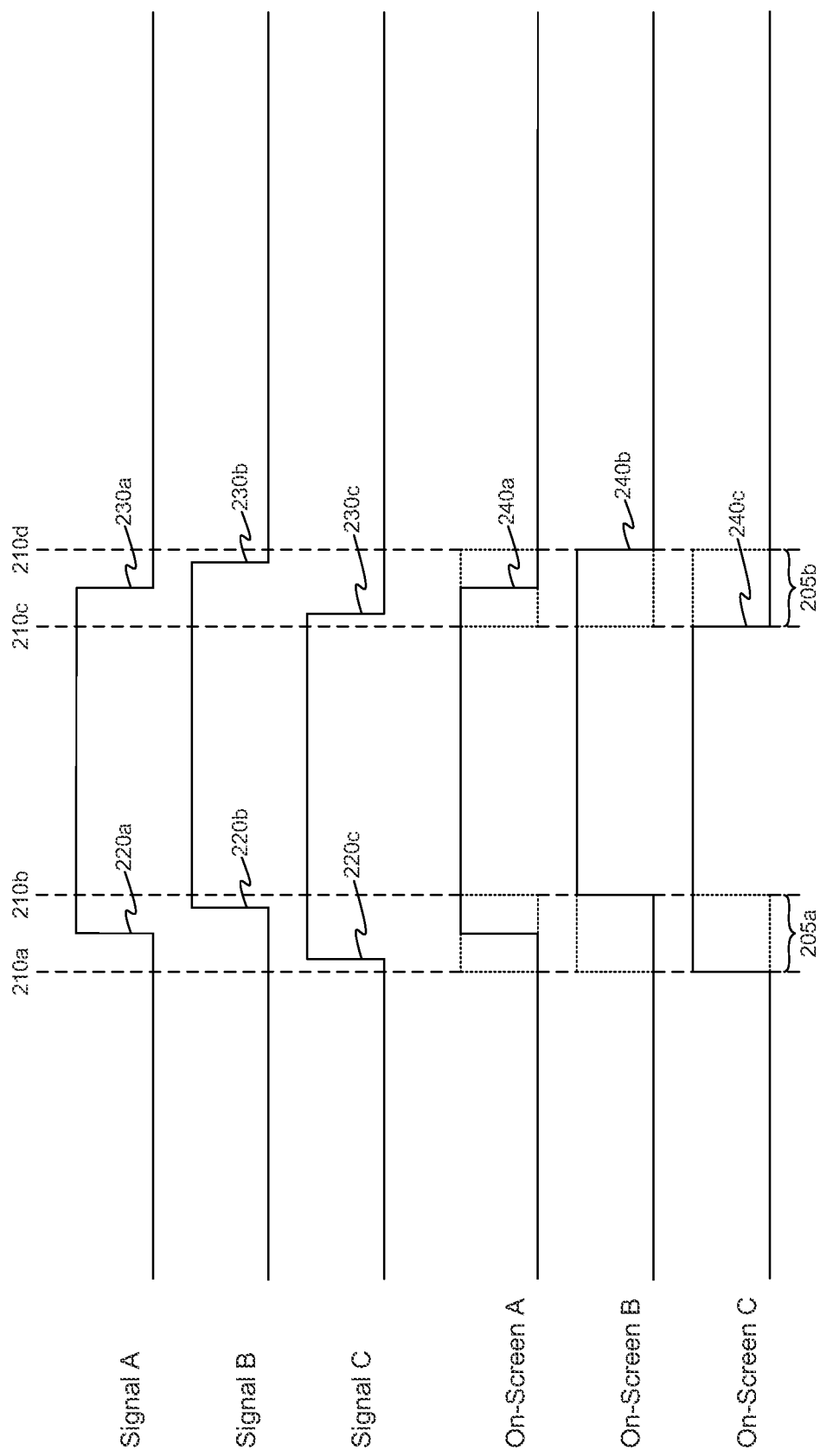
FIG. 2 depicts three averaged waveforms resulting from three digital signals according to embodiments of the invention.

An embodiment of the invention, as depicted in FIG. 2, is a method that accumulates acquisition data for the digital signal transitions over multiple acquisitions. It tracks the number of times an edge is correlated to a sampling bin boundary. The correlated counts may be used to generate a weighted average, which are in turn used to place the drawn edge between digital sample points on-screen. For instance, Signal A's rising edge 220a will be evenly distributed between the two closest sampling bin boundaries 210a and 210b. Falling edge 230a will, likewise, be evenly distributed between the two closest sampling bin boundaries 210c and 210d. Signal B's rising edge 220b will be heavily weighted toward sampling bin boundary 210b, as will its falling edge 230b be heavily weighted toward sampling bin boundary 210d. Lastly, Signal C's rising edge 220c will be weighted toward sampling bin boundary 210a, and its falling edge 230c will be weighted toward sampling bin boundary 210c.

The resulting Digital Edge Averaged (DEA) display is illustrated in FIG. 2 as average waveforms 240a-c. Each of the DEA waveforms 240a-c is superimposed over the conventionally sampled acquisitions. The jitter of the conventional waveform, as would be found in sampling bins 205a and 205b, is depicted by dotted lines.

Display of waveforms 240a-c give the user much more valuable information during live updates. The user today cannot see which signals are leading or lagging each other as is possible with DEA waveforms 240a-c. Timing data not otherwise available is revealed, and that timing data resolves to a better resolution than the base digital sample rate. The resulting waveforms are displayed in a way that is much more familiar to digital designers so that they need not interpret the display features unique to digital acquisition devices. The displayed waveforms more closely resemble timing diagrams from their documentation and simulation outputs. Vertical cursors and automated measurements, in alternate embodiments, may use the averaged edge information to attain more accurate measurement results.

The simplified description above works well when individual signal transitions in the same direction (like-kind rising and falling edges) are separated by a relatively large number of sampling bins, or "dwell" time, and the edges themselves fall into a relatively small number of sampling bins, or "aperture" time, relative to the trigger event. There will always be a device-dependent minimum dwell to aperture ratio required for DEA to be feasible. The various acquisition device and user-dependent jitter effects described above and below will tend to spread the edge transitions over more sampling bins. This increases the aperture, decreases dwell, and degrades the dwell to aperture ratio.

Figure 3:
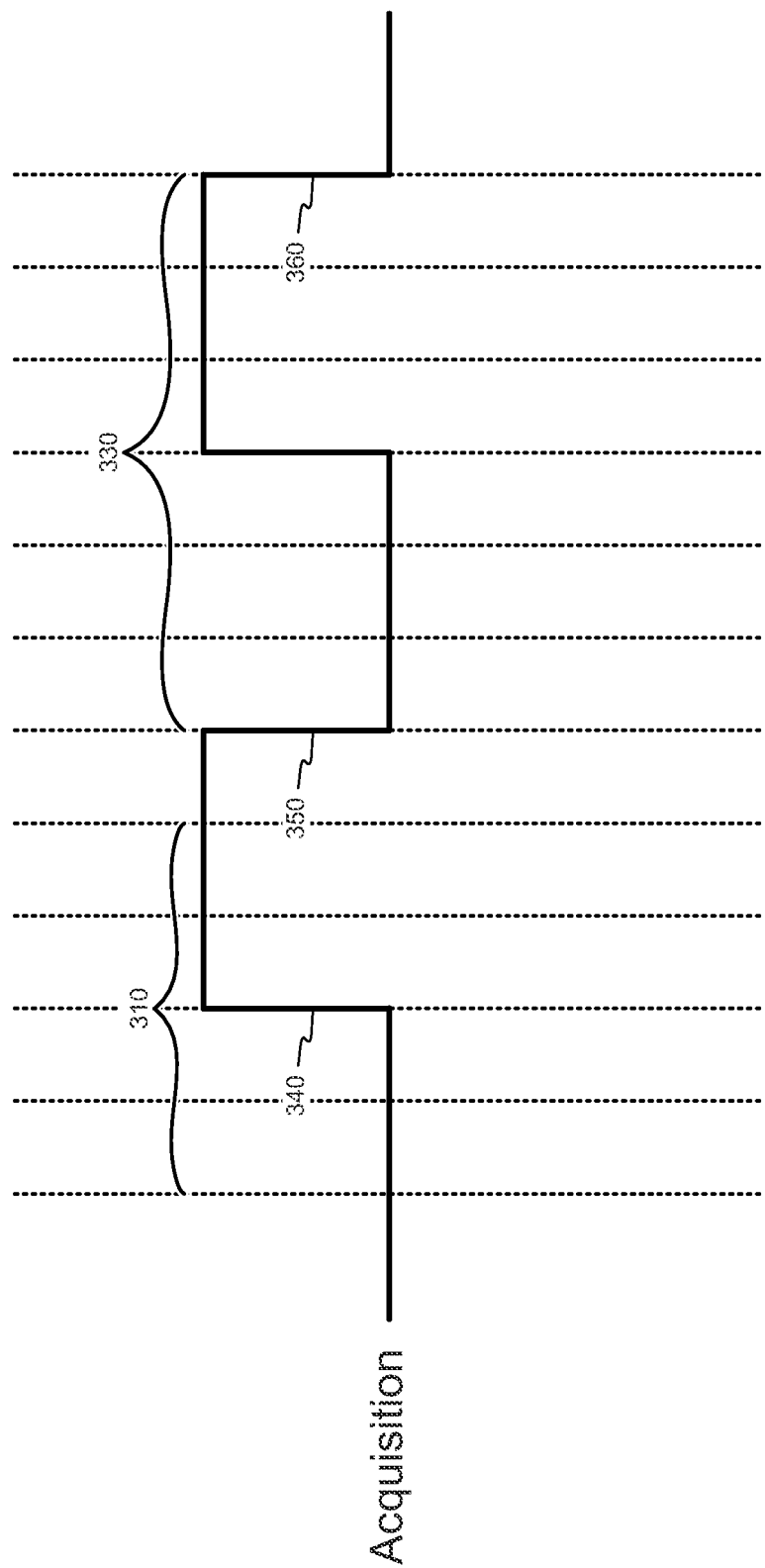
FIG. 3 illustrates the use of aperture and dwell according to embodiments of the invention.

Dwell is more formally defined as a minimum amount of time that must transpire after the detection of an edge, or a transition between logic levels, and the detection of a subsequent edge of like-kind polarity (rising versus falling). Dwell is a function of aperture, which implies that it is a function of variables originating from the system under test and the digital acquisition device. Referring to the embodiment of FIG. 3, sampling bins are two nanoseconds in length. Dwell 330 is the minimum distance that must separate like-kind edges 350 and 360 in order to generate a DEA waveform. Dwell 330 is generated from the dwell to aperture ratio, in this case 3/2. The numerator of the ratio is multiplied by the nearest integer multiple of the sample rate (6 ns×2=12 ns) to produce a dwell 330 of six sampling bins. An aperture 310 of four sampling bins is also shown in FIG. 3, and is described in greater detail in FIG. 4. Note that aperture 310 is centered on rising edge 340 and presents an uncertainty of ±2 sampling bins.

Figure 4:
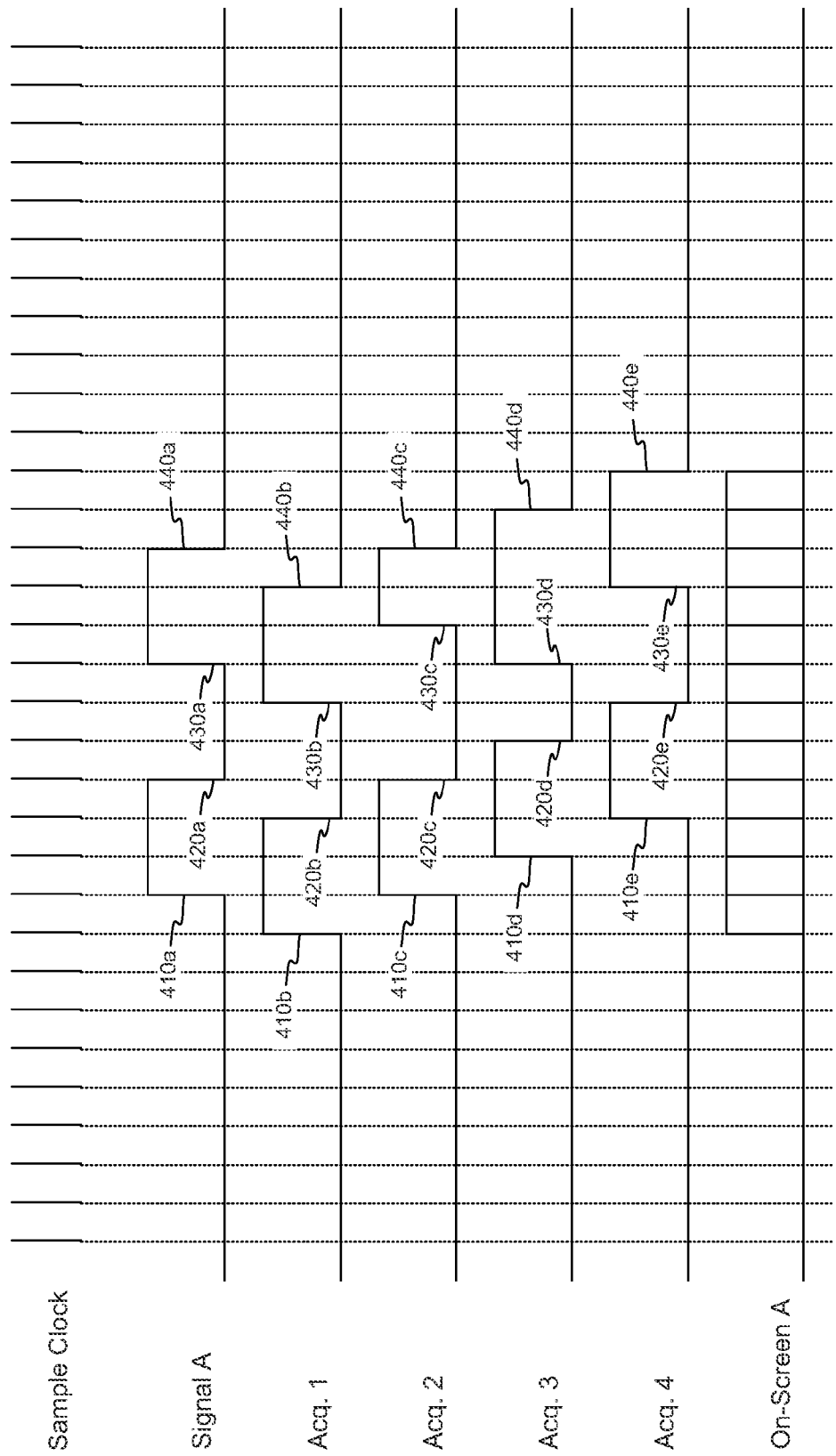
FIG. 4 shows a conventional On-Screen display of a Signal A according four acquisitions of Signal A by a digital acquisition device.

A sample clock for a conventional acquisition device is depicted in FIG. 4 and is sampling every two nanoseconds. Each vertical division represents a pulse of the clock, or sampling bin boundary, depicted as a dashed line. Signal A is repeated over time, allowing it to be acquired by a digital acquisition device on four separate occasions, represented by Acq. 1, Acq. 2, Acq. 3, and Acq. 4.

The conventional device of FIG. 4 has an aperture of four sampling bins, centered on the rising edge 410a of Signal A. That is, the acquisition device contributes four nanoseconds, or two sampling bins, of uncertainty to digital channels. It is probing a user circuit that also contributes four nanoseconds, or two sampling bins, of uncertainty between the trigger event and the digital transition. The uncertainty of the acquisition device and the user circuit compound to create an uncertainty of four sampling bins, its aperture.

Further illustrating this are the four acquisitions of Signal A in FIG. 4. Rising edge 410a of Signal A, when acquired by Acq. 1, is placed on an adjacent sampling bin boundary corresponding to rising edge 410b. The second acquisition, Acq. 2, places rising edge 410c on the same sampling bin boundary as rising edge 410a. The third acquisition, Acq. 3, places rising edge 410d on a sampling bin boundary adjacent to the boundary for rising edge 410a, and the fourth acquisition, Acq. 4, places rising edge 410e on a sampling bin boundary that is separated by two sampling bins in relation to the boundary for rising edge 410a. Rising edges 410a-e illustrate that during acquisition, this instance of an acquisition device may place a rising edge anywhere within an aperture window of four sampling bins, centered on the rising edge 410a of Signal A. This reflects jitter of plus or minus two sampling bins.

The conventional acquisition device of FIG. 4 is set to repeatedly trigger on rising edge 410a. Four acquisitions, Acq. 1-4, will be displayed in rapid succession as the On-Screen A waveform. The resulting waveform is a jumbled and nonsensical representation of Signal A, of little value to a user of the acquisition device.

Figure 5:
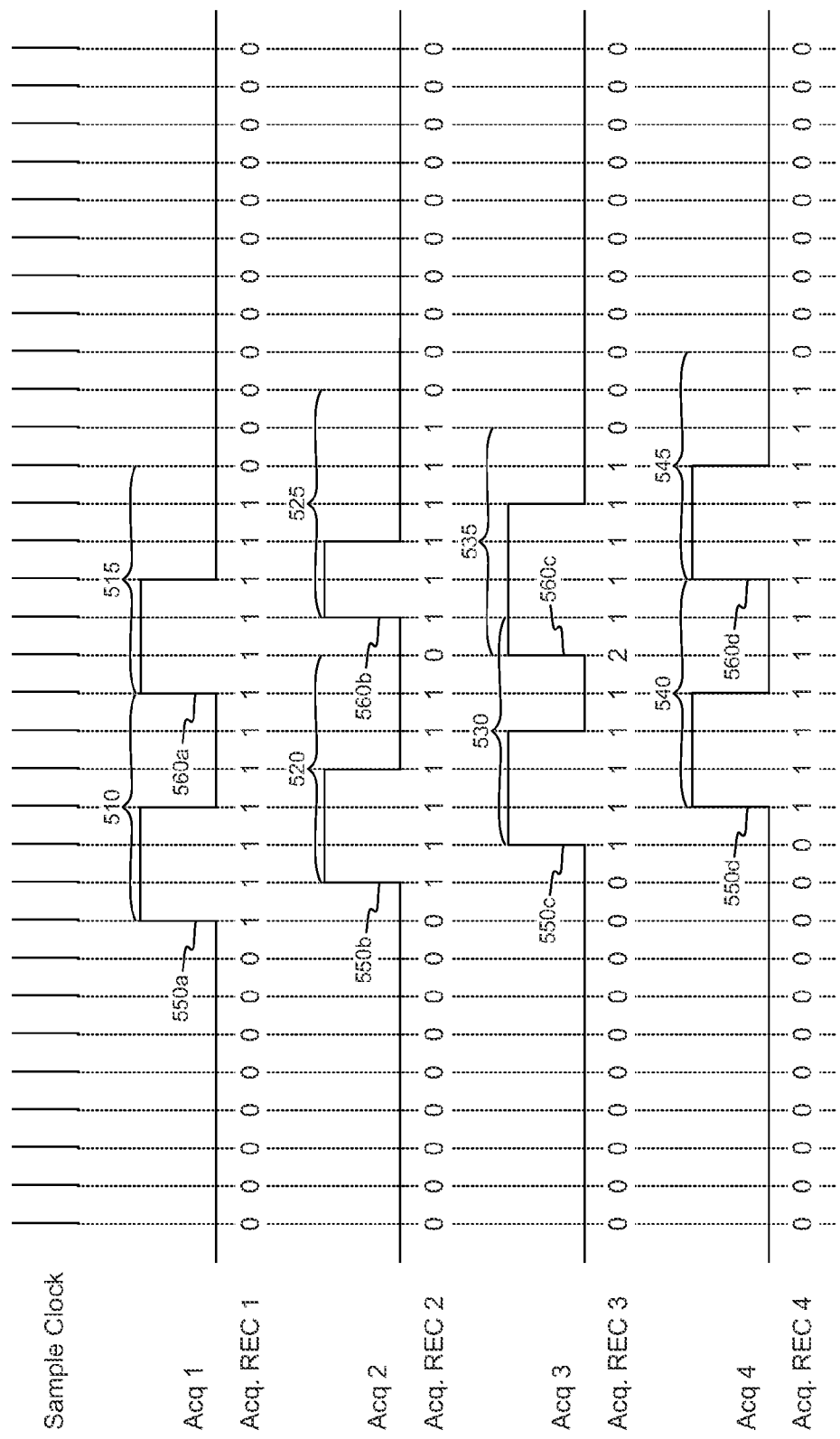
FIG. 5 illustrates the rising edge count (REC) and their corresponding dwells for each of the digital acquisitions shown in FIG. 4 according to embodiments of the invention.

The embodiment of FIG. 5 illustrates an attempt to perform DEA with the conventional device of FIG. 4. Each time a single acquisition is performed, the DEA hardware keeps a separate running count of each type of edge detected (rising and falling). FIG. 5 illustrates only the rising edge count (REC), but a parallel circuit may perform the same operation on falling edges, resulting in a falling edge count (FEC). The REC is incremented by one whenever a rising edge is found on a sampling bin boundary. The count then remains unchanged during the dwell, after which it decrements by one. The REC counts are labeled as such underneath the four acquisitions as Acq. REC 1-4. The two rising edges 550a and 560a of Acq. 1 are separated by dwell 510, and dwell 515 follows rising edge 560a. Two rising edges 550d and 560d of Acq. 4 are, likewise, separated by dwell 540, and dwell 545 follows rising edge 560d. The count for Acq. 1 initiates on the sampling bin boundary where rising edge 550a is placed. Six consecutive sampling bin boundaries receive an integer value of one, attributable to the duration of dwell 510. Upon the seventh sampling bin boundary, the boundary where rising edge 560a is placed, the count originating from rising edge 550a is decremented. The rising edge 560a initiates a new count, which lasts for the duration of dwell 515. A similar pattern may be observed with Acq. 4, Acq. REC 4, rising edges 550d and 560d, and dwells 540 and 545.

In contrast, one sampling bin separates rising edge 560b and the expiration of dwell 520. On the seventh sampling bin boundary that follows rising edge 550b, the count is 0, denoting a decremented value. A similar observation can be made with dwells 515, 525, 535, and 545, wherein the REC count decrements to zero on the seventh sampling bin boundary. Further illustrating the rubric for REC is Acq. REC 3. The dwells 530 and 535 overlap by one sampling bin. The sampling bin boundary on which rising edge 560c is located already possesses an integer value originating from rising edge 550c, and it receives another due to rising edge 560c. Thus, the count for that sampling bin boundary is two rather than one.

Existing digital acquisition systems contain edge detection hardware that can flag sampling bins in which multiple edges are detected. Currently, no intra-bin timing data is stored with this flag, but this type of edge detection can be useful for DEA determination. In an alternate embodiment of the invention, a sample on which multiple edges are detected, but the end logic value does not change from that of the previous sample, is assumed to contain two edges of opposite polarity. A further assumption of this embodiment is that the analog performance of the probing device only supports two edges in the time span of one sample. In this case, both the REC and FEC are incremented by one on the sampling bin boundary. This allows DEA to recover pulses that are smaller in width than the base sample rate.

If multiple edges are detected, but the end logic value changes from the value of the previous sample, two like edges are detected during the same sample, DEA is not possible for these transitions. In this case, an embodiment of the invention will increase the corresponding counter (REC or FEC) by two in the single corresponding sampling bin. An increase of two will disqualify this edge in the DEA determination later in the process, as is discussed in FIG. 6.

For the embodiment of FIG. 6, REC values are used to determine each edge's fitness for use (FFU) in generating a DEA waveform. Acquisition data is pipelined by a number of sampling bins equal to the dwell, and in the case of FIG. 6, the dwell 620 is six sampling bins. A look-forward function generates a FFU band around each edge. This is illustrated in FIG. 6 for the case of rising edges. For each of Acq. 1, 2, and 4, corresponding FFU signals are asserted high since no REC values are greater than one, as determined by the values in FIG. 5. For Acq. 3, the look-ahead function peers six sampling bins into the future from sampling bin boundary 605. It then asserts Acq. 3 FFU to logic low 610 when it encounters a REC greater than or equal to two, as is the case with Acq. REC 3 in FIG. 5 and rising edge 560c. If the function determines that the offending sampling bin boundary has passed with an elapse of the clock, and there are no other offending boundaries six sampling bins in advance, then the FFU signal is asserted high, as in the case of logic high 630.

All signal edges in FIG. 6 are deemed fit for use except for the rising edges of Acq. 3. The look ahead function of the FFU signal disqualifies both rising edges of Acq. 3 with a resulting waveform band that wraps rising edges 640 and 650. Although not illustrated in FIG. 6, it can be shown that the falling edge FFU signals for Acq. 1-4 deemed all falling edges fit for use.

The flagging of rising edges in Acq. 3 as unfit for use will disqualify those edges as candidates for DEA entirely. The resulting DEA waveform will not be a true average unless all edges in all acquisitions are used in the calculation of the average, and resulting measurements on DEA waveforms could be misleading. However, incomplete averages are still useful for recreating coherent and useful waveforms for display.

Once FFU flags are generated, the edges from multiple acquisitions are accumulated in acquisition memory, as shown in the embodiment of FIG. 7. Edge types are segregated by polarity (rising versus falling). Each time a rising edge is found in the incoming acquisition with a valid FFU flag (logic high), the acquisition memory location corresponding to that sampling bin boundary is incremented. The same is done for falling edges. This results in a memory map of rising edge distributions and a memory map of falling edge distributions. AM-R (acquisition memory rising) is a stored tally of rising edges, and AM-F (acquisition memory falling) is a stored tally of falling edges. Observe that for sampling bin boundary 710 the AM-R for Acq. 1 is stored as an integer of one. Similarly valid values are stored for Acq. 2 and Acq. 4, correlated to sampling bin boundaries 715 and 725, respectively. The AM-R value for rising edge 730c is an integer value of zero on sampling bin boundary 720 because it was invalidated as not fit-for-use.

Because the FFU flags exclude edges that are too close together, it is guaranteed that there will be some number of zero count bins between valid edge distributions. The dwell to aperture ratio is enforced. It is also guaranteed that if all occurrences of a particular edge were deemed fit for use, there will be an aperture-wide band in acquisition memory representing that edge in which the sum of all edge detections is exactly equal to the number of acquisitions used for averaging.

FIG. 7 further illustrates the concept of running sums (RS) for both edge types, rising (RS-R) and falling (RS-F). The running sum operation takes a number of consecutive sampling bins from memory equal to aperture and sums the number of edges found in that window of time. This is done for every sampling bin correlated to each edge type. For example, the AM-R value located on sampling bin boundary 710 indicates a valid rising edge 730a. Consequently, an integer is allocated to sampling bin boundaries 703, 705, 710, 715, and 720. Moving on to the AM-R value located on sampling bin boundary 715, the value of one indicates a valid rising edge 730b. Consequently, integers are allocated to sampling bin boundaries 705, 710, 715, 720, and 725, and they are summed with the integer values that were previously allocated to overlapping sampling bin boundaries 705, 710, 715, and 720. This process is repeated for all stored AM-R values, and likewise, all stored AM-F values.

Two curves (rising and falling) result, each with peaks corresponding to edges. For edges that are deemed fit for use in all acquisitions, there will be at least one (but not strictly limited to one) sampling bin boundary in which the RS value is equal to the number of acquisitions taken for the DEA operation. This may be observed in RS-F value 740, where the sum is four and is equal to the number of acquisitions, Acq. 1-4.

For instances where not all edges are deemed fit for use, running sums may fall short of the number of acquisitions. Note that rising edge 730c was flagged as not fit for use in FIG. 6. Thus, its AM-R value on sampling bin boundary 720 is zero. No integers are allocated to sampling bin boundaries 710, 715, 720, 725, and 727, as opposed to what would normally be the case if rising edge 730c is declared fit for use. As a consequence, the rising sum for edges 730a-d comes to three, as donated by rising sum 735, which is an amount less than the four data acquisitions.

Using the RS values of FIG. 7, rough edge placement is determined Any single RS value or group of consecutive RS values equal to the number of acquisitions represents a single edge. The acquisition device will flag rough edge placement by parsing through the RS values. If multiple consecutive RS values are found to equal the number of acquisitions, the first of the group is considered the rough edge placement. A weighted average is then performed on the group of REC or FEC counts found in the aperture centered around the rough-edge sample point. This average is used to calculate an offset from the rough sample point. The rough sample point location plus the calculated offset then locates the DEA edge in the X dimension relative to the trigger event, independent of the base sample rate.

For a DEA operation where all edges are found to be fit for use, this is enough to construct the entire DEA waveform. In FIG. 7, however, a pair of rising edges is thrown out in Acq. 3. As a result, rough edge placement for those edges is not easily found because there is no sampling bin boundary corresponding to either of those rising edges where the RS value is equal to the number of acquisitions. However, there is still enough data in acquisition memory to reconstruct a reasonable, but not perfect, waveform. Because all of the falling edges are identified, boundaries in which single rising edges must exist are known. There will always be one and only one opposite polarity edge between known like-kind edges that are roughly placed. If, during processing of the DEA waveform, rough placement for an edge is missing, then the surrounding two opposite polarity edges may be used to recover something close to the missing edge. The acquisition device searches memory space corresponding to the sampling bins between the surrounding two rough edges of opposite polarity and returns the sample with the highest RS value, using only the first occurring value if that value is repeated in the given space. In FIG. 7, rising sum 735 becomes the rough placement for rising edges 730a-d due to its proximity to falling sum 740. This sample becomes the rough placement for that edge, and a weighted average is performed on the group of REC or FEC counts found in the aperture centered around the rough-edge sample point.

FIG. 8 further illustrates the attempted recovery of the final DEA waveform. Because rising edges are calculated using an incomplete average, some indication needs to be given on screen that an edge is based on an incomplete data set. Some embodiments may include a mechanism to either prohibit or warn the user if he attempts to use edges constructed from an incomplete average for measurement purposes. An exemplary display may draw troubled edges in red.

There is an interesting comparison between the conventional On-Screen representation of the acquired waveform at the bottom of FIG. 3 and the DEA waveform at the bottom of FIG. 8. The conventional representation of the example waveform in FIG. 3 is unintelligible. No edge information is discernible. In contrast, rising and falling edges can move around due to jitter and may even overlap each other in time from one acquisition to the next. DEA is still able to untangle them. This makes DEA useful for recovering signals that transition at a rate similar to the aperture width. Such signals result in unintelligible conventional displays, histograms, or persistence graphs. DEA, however, decouples jitter effects from the signal the user wants to see and elegantly reveals it to the user in a display.

In alternate embodiments of the invention, the dwell to aperture ratio could be left to the user to select through the user interface, since there are many considerations dependent on the user's system under test. A user that knows he has a very tight relationship between his trigger event and the digital edges may want to force the acquisition system to use a very small aperture value and, therefore, allow the device to perform DEA on more closely spaced edges. On the other hand, a user with a very slowly transitioning signal could choose a very large dwell to aperture ratio so as to allow the acquisition device to properly identify widely jittering edges. In yet another embodiment, an acquisition device might select the most appropriate ratios based on the incoming acquisition data.

In other embodiments, the entire DEA operation may be performed with software using a conventional digital acquisition device. However, other embodiments of the invention may accelerate performance of some functions in dedicated hardware. For example, if dedicated hardware performed all of the described operations required to generate the AM-R and AM-F counts (as illustrated in FIG. 7) at acquisition time, it would leave enough information in acquisition memory to reconstruct DEA waveforms during display processing. In a preferred embodiment, DEA steps would best be performed by software. Software may process the entire acquisition after the acquisition is stopped or only process the segment of the waveform required for on-screen display.

Having described and illustrated the principles of the invention in a preferred embodiment thereof, it should be apparent that the invention can be modified in arrangement and detail without departing from such principles. I claim all modifications and variation coming within the spirit and scope of the following claims.

The invention claimed is:

1. A method, comprising:
   a signal processing instrument receiving a first signal and a second signal;
   identifying a rising edge and a falling edge of each of the first and second signals in each of a plurality of acquisitions;
   for each of the rising edges and falling edges of the first and second signals identified in each of the plurality of acquisitions, tracking a number of times the edge is correlated to a particular one of a plurality of sampling bin boundaries; and
   displaying a waveform corresponding to the plurality of acquisitions on a display coupled to the signal processing instrument, wherein the displaying includes, responsive to the number of times any of the rising edges and falling edges of the first and second signals is correlated to a particular one of the plurality of sampling bin boundaries, heavily weighting the edge toward the particular sampling bin boundary.

2. The method of claim 1, further comprising storing the number of times each of the rising edges and falling edges of the first and second signals is correlated to a particular one of the plurality of sampling bin boundaries in memory.

3. The method of claim 1, wherein the displaying further includes, responsive to any of the rising edges and falling edges of the first and second signals not being correlated to a particular one of the plurality of sampling bin boundaries, evenly distributing the edge between two successive sampling bin boundaries with which the edge is most correlated.

4. The method of claim 1, further comprising superimposing the waveform over a waveform corresponding to the plurality of acquisitions without any adjustment.

5. The method of claim 3, further comprising superimposing the waveform over a waveform corresponding to the plurality of acquisitions without any adjustment.

6. The method of claim 1, further comprising:
   the signal processing instrument receiving a third signal;
   identifying a rising edge and a falling edge of the third signal in each of the plurality of acquisitions; and
   for each of the rising and falling edges of the third signal identified in each of the plurality of acquisitions, tracking a number of times the edge is correlated to a particular one of the plurality of sampling bin boundaries.

7. The method of claim 6, wherein the displaying includes, responsive to the number of times any of the rising and falling edges of the third signal is correlated to a particular one of the plurality of sampling bin boundaries, heavily weighting the edge toward the particular sampling bin boundary.

8. The method of claim 7, wherein the displaying further includes, responsive to any of the rising and falling edges of the third signal not being correlated to a particular one of the plurality of sampling bin boundaries, evenly distributing the edge between two successive sampling bin boundaries with which the edge is most correlated.

9. The method of claim 6, further comprising storing the number of times each of the rising and falling edges of the third signal is correlated to a particular one of the plurality of sampling bin boundaries in memory.

10. The method of claim 7, further comprising superimposing the waveform over a waveform corresponding to the plurality of acquisitions without any adjustment.

11. The method of claim 1, further comprising using vertical cursors, automated measurements, or both vertical cursors and automated measurements to attain more accurate measurement results based on the tracking and displaying.

* * * * *